United States Patent
Galbraith et al.

(10) Patent No.: US 11,545,999 B2
(45) Date of Patent: *Jan. 3, 2023

(54) TRANSFORMATION OF DATA TO NON-BINARY DATA FOR STORAGE IN NON-VOLATILE MEMORIES

(71) Applicant: Western Digital Technologies, Inc., San Jose, CA (US)

(72) Inventors: Richard Leo Galbraith, Rochester, MN (US); Jonas Andrew Goode, Lake Forest, CA (US); Niranjay Ravindran, Rochester, MN (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/182,157

(22) Filed: Feb. 22, 2021

(65) Prior Publication Data

US 2021/0175903 A1 Jun. 10, 2021

Related U.S. Application Data

(63) Continuation of application No. 16/714,601, filed on Dec. 13, 2019, now Pat. No. 10,965,321, which is a
(Continued)

(51) Int. Cl.
*G06F 11/10* (2006.01)
*G11C 29/52* (2006.01)
(Continued)

(52) U.S. Cl.
CPC ......... *H03M 13/1171* (2013.01); *C09B 11/24* (2013.01); *C09B 69/008* (2013.01);
(Continued)

(58) Field of Classification Search
CPC ......... H03M 13/1171; H03M 13/1108; H03M 13/1111; C09B 69/103; C09B 11/24;
(Continued)

(56) References Cited

U.S. PATENT DOCUMENTS 7,293,149 B2 11/2007 Lo
8,644,067 B2 2/2014 Jeon
(Continued)

FOREIGN PATENT DOCUMENTS

| CN | 1941636 | 4/2007 |
|---|---|---|
| CN | 101958688 | 1/2011 |
| KR | 2009-0117712 | 11/2009 |

OTHER PUBLICATIONS

Aslam et al. "Non-binary LDPC code with multiple memory reads for multi-level-cell (MLC) flash," Dec. 2014, Signal and Information Processing Association Annual Summit and Conference (APSIPA), 9 pages.
(Continued)

*Primary Examiner* — Guy J Lamarre
(74) *Attorney, Agent, or Firm* — Morgan, Lewis & Bockius LLP

(57) ABSTRACT

A data storage system and method are provided for storing data in non-volatile memory devices. Binary data is received for storage in a non-volatile memory device. The binary data is converted into non-binary data comprising base-X values, where X is an integer greater than two. The non-binary data is encoded to generate a codeword and the codeword is written to a wordline of the non-volatile memory device.

20 Claims, 6 Drawing Sheets

Related U.S. Application Data continuation of application No. 15/662,158, filed on Jun. 14, 2017, now Pat. No. 10,530,391.

(60) Provisional application No. 62/368,953, filed on Jul. 29, 2016.

(51) Int. Cl.

| | | |
|---|---|---|
| *G11C 29/04* | (2006.01) | |
| *H04L 1/00* | (2006.01) | |
| *H03M 13/00* | (2006.01) | |
| *H03M 13/11* | (2006.01) | |
| *G06F 9/30* | (2018.01) | |
| *H03M 13/27* | (2006.01) | |
| *F21V 9/30* | (2018.01) | |
| *C09B 11/24* | (2006.01) | |
| *C09B 69/00* | (2006.01) | |
| *C09B 69/10* | (2006.01) | |
| *C09K 11/06* | (2006.01) | |
| *G02F 1/13357* | (2006.01) | |
| *G03F 7/00* | (2006.01) | |
| *H01L 51/00* | (2006.01) | |
| *G02F 1/1335* | (2006.01) | |

(52) U.S. Cl.
CPC .......... *C09B 69/103* (2013.01); *C09K 11/06* (2013.01); *F21V 9/30* (2018.02); *G02F 1/133617* (2013.01); *G03F 7/0007* (2013.01); *G06F 11/1012* (2013.01); *G06F 11/1068* (2013.01); *G06F 11/1072* (2013.01); *G11C 29/52* (2013.01); *H01L 51/0051* (2013.01); *H01L 51/0061* (2013.01); *H01L 51/0071* (2013.01); *H01L 51/0072* (2013.01); *H03M 13/1108* (2013.01); *H03M 13/1111* (2013.01); *C09K 2211/1048* (2013.01); *G02F 1/133614* (2021.01)

(58) Field of Classification Search
CPC ................. C09B 69/008; C09K 11/06; C09K 2211/1048; H01L 51/0071; H01L 51/0061; H01L 51/0051; H01L 51/0072; G06F 11/1012; G06F 11/1072; G06F 11/1068; F21V 9/30; G03F 7/0007; G02F 1/133617; G02F 2001/133614; G11C 29/52
See application file for complete search history.

(56) References Cited

U.S. PATENT DOCUMENTS

| | | | |
|---|---|---|---|
| 8,656,263 | B2 | 2/2014 | Hu et al. |
| 8,924,812 | B2 | 12/2014 | Li et al. |
| 8,954,820 | B2 | 2/2015 | Nemati Anaraki et al. |
| 9,086,984 | B2 | 7/2015 | Alhussien et al. |
| 9,130,590 | B2 | 9/2015 | Liu et al. |
| 9,337,864 | B1 | 5/2016 | Vakilinia et al. |
| 9,378,192 | B2 | 6/2016 | Schwartz et al. |
| 10,530,391 | B2 * | 1/2020 | Galbraith ............ G06F 11/1072 |
| 10,965,321 | B2 * | 3/2021 | Galbraith ............. C09B 69/103 |
| 2004/0255188 | A1 | 12/2004 | Lo |
| 2008/0239830 | A1 | 10/2008 | Lee |
| 2009/0161466 | A1 | 6/2009 | Hamilton |
| 2010/0014349 | A1 | 1/2010 | Mokhlesi |
| 2013/0145235 | A1 | 6/2013 | Alhussien et al. |
| 2014/0269093 | A1 | 9/2014 | Maejima |
| 2014/0281819 | A1 | 9/2014 | Wood |
| 2015/0303942 | A1 | 10/2015 | Zhang |
| 2015/0326249 | A1 | 11/2015 | Zhang |
| 2016/0049192 | A1 | 2/2016 | Lee |
| 2018/0351577 | A1 | 12/2018 | Qin |
| 2019/0156890 | A1 | 5/2019 | Widjaja |

OTHER PUBLICATIONS

Jeon et al. "A multibit-per-cell memory model and nonbinary LDPC codes," Dec. 2010, IEEE GLOBECOM Workshops, pp. 1895-1899.
Maeda et al. "Error Control Coding for Multilevel Cell Flash Memories Using Nonbinary Low-Density Parity-Check Codes," Oct. 2009, 24th International Symposium on Defect and Fault Tolerance in VLSI Systems, pp. 367-375.
Chinese Office Action from 201710679203.1, dated Jun. 23, 2020, 39 pages.

* cited by examiner

| Levels per Cell | Encoded Bits per Cell | 1kB CWs in 16kB Cells | 2kB CWs in 16kB Cells | 4kB CWs in 16kB Cells |
|---|---|---|---|---|
| 2 | 1.000 | 16.0 | 8.0 | 4.0 |
| 3 | 1.585 | 25.0 | 12.0 | 6.0 |
| 4 | 2.000 | 32.0 | 16.0 | 8.0 |
| 5 | 2.322 | 37.0 | 18.0 | 9.0 |
| 6 | 2.585 | 41.0 | 20.0 | 10.0 |
| 7 | 2.807 | 44.0 | 22.0 | 11.0 |
| 8 | 3.000 | 48.0 | 24.0 | 12.0 |
| 9 | 3.170 | 50.0 | 25.0 | 12.0 |
| 10 | 3.322 | 53.0 | 26.0 | 13.0 |
| 11 | 3.459 | 55.0 | 27.0 | 13.0 |
| 12 | 3.585 | 57.0 | 28.0 | 14.0 |
| 13 | 3.700 | 59.0 | 29.0 | 14.0 |
| 14 | 3.807 | 60.0 | 30.0 | 15.0 |
| 15 | 3.907 | 62.0 | 31.0 | 15.0 |
| 16 | 4.000 | 64.0 | 32.0 | 16.0 |

FIGURE 4

TRANSFORMATION OF DATA TO NON-BINARY DATA FOR STORAGE IN NON-VOLATILE MEMORIES

This application is a continuation of application Ser. No. 16/714,601, filed on Dec. 13, 2019, now U.S. Pat. No. 10,965,321, which is a continuation of application Ser. No. 15/662,158, filed on Jul. 27, 2017, now U.S. Pat. No. 10,530,391, which claims the benefit of U.S. Provisional Application No. 62/368,953, filed on Jul. 29, 2016, the entirety of each of which is incorporated herein by reference.

BACKGROUND

Data is stored in flash memory by programming flash memory cells to program levels corresponding to desired data values. As flash memory technology has improved, the number of program levels available for programming in individual flash memory cells has increased from the two program levels available in single level cell (SLC) NAND flash memory used to store one bit of data. For example, multi-level cell (MLC) NAND flash memory utilizes four program levels to store two bits of data in each flash memory cell, triple-level cell (TLC) NAND flash memory uses eight program levels to store three bits of data in each flash memory cell, and quad-level cell (QLC) NAND flash memory uses sixteen program levels to store four bits of data in each flash memory cell. As newer technologies such as 3D NAND flash memory provide even higher numbers of available program levels, the binary nature of how data currently is written to and read from flash memory impedes the performance of flash memory.

SUMMARY

According to aspects of the subject technology, a method is provided that includes receiving binary data for storage in a non-volatile memory device and converting the binary data into non-binary data. The method further includes encoding the non-binary data to generate a codeword and writing the codeword to a wordline of the non-volatile memory device.

According to aspects of the subject technology, a data storage system is provided. The data storage system includes a plurality of non-volatile memory devices and a controller. The controller is configured to receive first binary data for storage in the data storage system and convert base-two values of the first binary data into first non-binary data comprising base-X values, where X is an integer greater than two. The controller is further configured to encode the first non-binary data to generate a first codeword and write the first codeword to a wordline of a first non-volatile memory device of the plurality of non-volatile memory devices.

According to aspects of the subject technology, a processor-readable medium encoded with instructions is provided that, when executed by a processor, perform a method. The method includes associating a non-volatile memory device with a value X based on a property of the non-volatile memory device, wherein X is an integer greater than two. The method further includes receiving binary data for storage in the non-volatile memory device and converting base-two values of the binary data into non-binary data comprising base-X values. The method further includes encoding the non-binary data to generate a codeword and writing the codeword to a wordline of the non-volatile memory device.

According to aspects of the subject technology, a data storage system is provided that includes a non-volatile memory device. The data storage system further includes means for receiving binary data for storage in the non-volatile memory device and means for converting base-two values of the binary data into non-binary data comprising base-X values, where X is an integer greater than two. The data storage system further includes means for encoding the non-binary data to generate a codeword and means for writing the codeword to a wordline of the non-volatile memory device.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

FIG. 4 is a table listing corresponding values for number of program levels per memory cell, number of encoded bits per memory cell, and numbers of 1 kB, 2 kB and 4 kB codewords that can be stored in a wordline of 16 kB memory cells.

DETAILED DESCRIPTION

Figure 1:
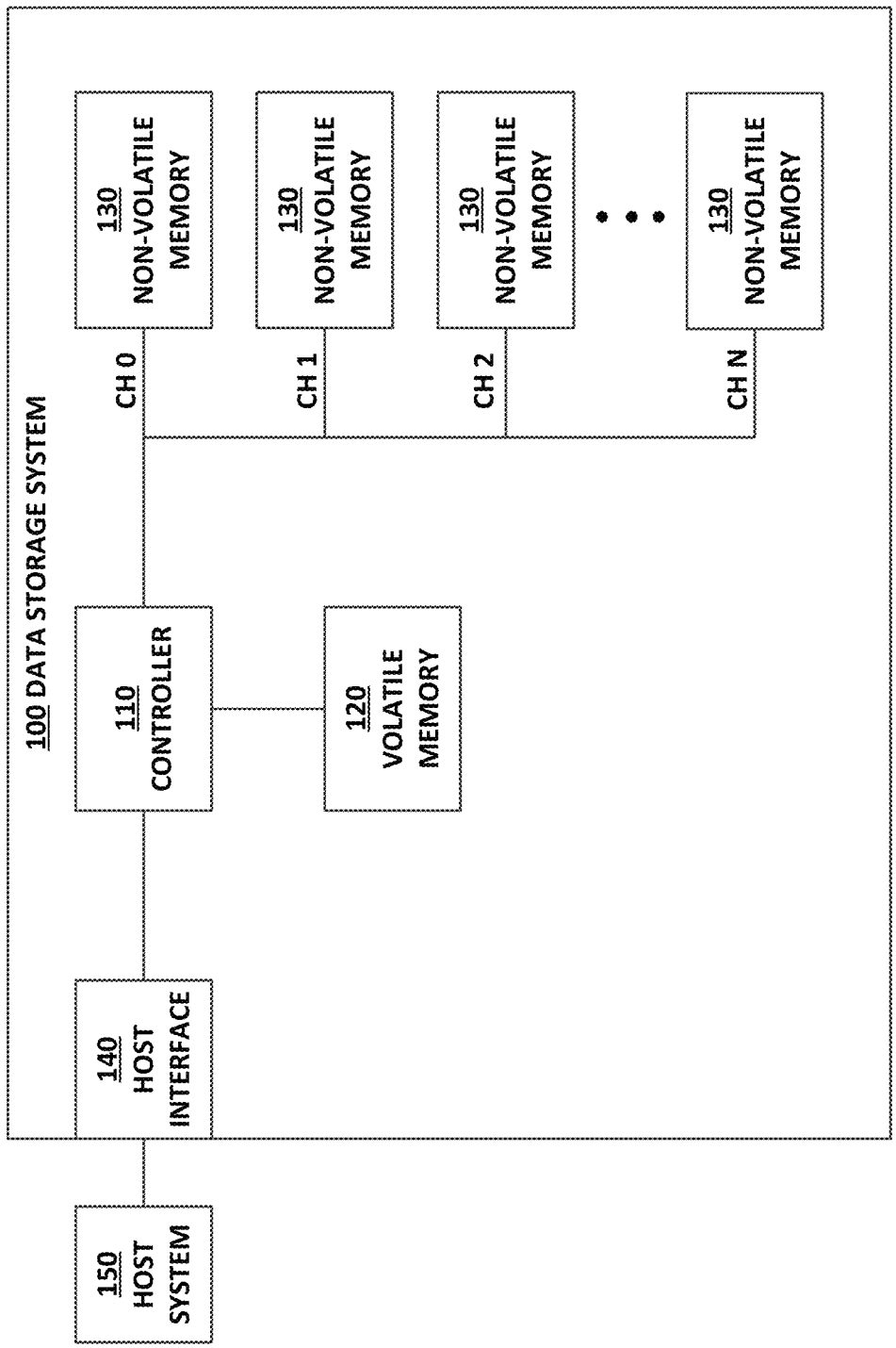
FIG. 1 is a block diagram illustrating components of a data storage system 100 according to aspects of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology may be practiced without these specific details. In some instances, structures and components are shown in block diagram form in order to avoid obscuring the concepts of the subject technology. Like components are labeled with identical element numbers for ease of understanding.

The subject technology moves away from the binary limitations of flash memory systems that are configured to store an integer number of binary bits per flash memory cell. Such flash memory systems are limited to using a number of programming levels equal to a power of two ($2^n$). For example as noted above, SLC NAND flash memory uses two programming levels to store a single bit, MLC NAND flash memory uses four programming levels to store two bits, and TLC NAND flash memory uses eight programming levels to store three bits. These types of flash memory may represent modes in which flash memory die are operated based on characteristics of the flash memory die. For example, newer or higher quality flash memory die may be capable of accurately programming and reading a larger number program levels to store data than the number of program levels that available in older or lower quality flash memory die. The binary limitations of these modes of operation force the flash memory systems to use two program levels, four program levels, eight program levels, sixteen program levels, etc. However, the binary limitations potentially leave capacity and performance of flash memory die that are capable of utilizing different numbers of program levels inaccessible.

The subject technology increases the flexibility with which flash memory die may be used by converting binary data into non-binary data and encoding the non-binary data using a non-binary encoding scheme such as non-binary low-density parity-check (LDPC) encoding prior to writing the data to a flash memory die. The number base of the non-binary data and non-binary encoding may be selected based on the number of program levels the flash memory die is capable of programming and reading at a desired error rate. For example, testing or simulation may determine that a flash memory die is capable of using seven program levels to store data. In this example, the base-two values of the binary data designated for storage are converted to base-seven values. The converted base-seven values may then be encoded into a codeword using non-binary LDPC where the non-zero elements of the encoding matrix are populated with elements of a Galois field GF(7). Once encoded, the codeword may be written to a wordline in the flash memory die. Each of the seven program levels corresponds to a respective unique symbol/digit in the base-seven numbering (e.g., 1, 2, 3, 4, 5, 6, 7) so that a memory cell stores a data value corresponding to a particular symbol/digit by programming the memory cell to the program level corresponding to the particular symbol/digit. Upon reading the codeword from the wordline, the codeword is decoded using the non-binary LDPC where the non-zero elements of the decoding matrix are populated with elements of the Galois field GF(7). Unlike the binary systems of MLC, TLC, QLC, etc. flash memory, the subject technology does not utilizes gray coding to read data from wordlines. The decoded non-binary data is then converted back into binary data. These operations are described in further detail below.

FIG. 1 is a block diagram illustrating components of a data storage system 100 according to aspects of the subject technology. As depicted in FIG. 1, data storage system 100 includes controller 110, volatile memory 120, non-volatile memory devices 130, and host interface 140. Controller 110 is configured to process requests received from host system 150 via host interface 140 to access data in non-volatile memory devices 130. The data access requests received from host system 150 may include write requests to store host data in non-volatile memory 130, read requests to retrieve host data stored in non-volatile memory devices 130, and erase requests to erase host data stored in non-volatile memory devices 130. Other types of requests, such as status requests or device management requests, may be received from host system 150 and processed by controller 110.

Host interface 140 is configured to couple host system 150 to data storage system 100. Host interface 140 may include electrical and physical connections for operably coupling host system 150 to controller 110. Via the electrical and physical connections, host interface 140 is configured to communicate data, addresses, and control signals between host system 150 and controller 110. Controller 110 is configured to store host data received from host system 150 in non-volatile memory devices 130 in response to a write request received from host system 150, and to read host data stored in non-volatile memory devices 130 and to transfer the read host data to host system 150 via host interface 140 in response to a read request received from host system 150.

Host interface 140 may implement standard interfaces including, but not limited to, Serial Advanced Technology Attachment (SATA), Advanced Technology Attachment (ATA), Small Computer System Interface (SCSI), PCI-extended (PCI-X), Fibre Channel, Serial Attached SCSI (SAS), Secure Digital (SD), Embedded Multi-Media Card (EMMC), Universal Flash Storage (UFS) and Peripheral Component Interconnect Express (PCIe). However, the subject technology is not limited to the use of standard interfaces and may utilize custom or proprietary interfaces for communications with host system 150.

Host system 150 represents any device configured to be coupled to and communicate with data storage system 100 via host interface 140 to store and retrieve data in data storage system 100. Host system 150 may be a computing device such as a personal computer, a server, a workstation, a laptop computer, a smart phone, and the like. Alternatively, host system 150 may be an electronic device such as a digital camera, a digital audio player, a digital video recorder, and the like.

Controller 110 is configured to monitor and control the operation of components of data storage system 100 in response to requests received from host system 150 and during execution of internal maintenance operations. Controller 110 may include a multi-core processor, a general-purpose microprocessor, a microcontroller, a digital signal processor (DSP), an application specific integrated circuit (ASIC), a field programmable gate array (FPGA), a programmable logic device (PLD), a state machine, gated logic, discrete hardware components, or a combination of the foregoing. In some aspects, one or more components of controller 110 may be integrated into a single chip or module, or may be implemented in two or more discrete chips or modules.

Volatile memory 120 represents memory used by controller 110 to temporarily store data and information used to manage data storage system 100. For example, controller 110 may use volatile memory 120 as buffers for host data waiting to be written to non-volatile memory devices 130 or host data read from non-volatile memory devices 130 waiting to be transferred to host system 150 or written back to non-volatile memory devices 130. Controller 110 may store various types of system data used in the management of data storage system 100 in volatile memory 120. The system data may include data for tracking the types of encoding used when storing data in different devices in non-volatile memory devices 130. The system data also may include tables mapping logical addresses referenced by host system 150 to physical addresses of non-volatile memory devices 130, program/erase (P/E) cycle counts, error statistics, valid/invalid data counts, etc. Controller 110 may store some or all of the data and information described above in non-volatile memory devices 130, or another form of non-volatile memory not shown, so as to preserve the data and information when data storage system 100 is shut down or otherwise loses power. Controller 110 may periodically store copies of the data and information in non-volatile memory devices 130 or may wait for a shutdown or power-loss event to back up the data and information in non-volatile memory devices 130.

Volatile memory 120 may be a random-access memory (RAM) such as static RAM (SRAM) or dynamic RAM (DRAM). However, the subject technology is not limited to any particular type of RAM. In addition, volatile memory 120 may be implemented using a single RAM module or multiple RAM modules. While volatile memory 120 is depicted as being distinct from controller 110, portions or all of volatile memory 120 may be incorporated into controller 110.

As depicted in FIG. 1, multiple non-volatile memory devices 130 are arranged in multiple channels. For example, FIG. 1 illustrates each of N channels having one non-volatile memory device 130. Each of the non-volatile memory devices 130 may include a single die or multiple die. Each die includes non-volatile memory cells, such as NAND flash memory cells or 3D NAND flash memory cells. Each of the non-volatile memory devices 130 may be implemented in respective chips or packages. While each channel is depicted as having a single non-volatile memory device 130, the subject technology may include implementations in which each channel includes two or more non-volatile memory devices 130.

The flash memory cells of a die may be arranged in physical blocks, with each block containing multiple wordlines. Each wordline includes a number of non-volatile memory cells (e.g., 1 kB, 2 kB, 4 kB, 16 kB, etc.). The subject technology is not limited to any particular number of wordlines in each physical block. For example, each block may contain 8 wordlines, 16 wordlines, 32 wordlines, etc. Furthermore, the number of physical blocks contained in each flash memory die is not limited to any particular number. In NAND flash memory, the page of a wordline, or the wordline as a whole, represents the smallest unit available for writing data to the flash memory die or reading data from the flash memory die. Physical blocks represent the smallest unit available for erasing data in the flash memory die.

Controller 110 is configured to communicate commands, control information, addresses, data, etc. with the flash memory die via the respective flash memory channels 0-N. Each channel may represent one or more buses configured to communicate electrical signals encoded with commands, control information, addresses, and/or data between controller 110 and the flash memory die coupled to the respective flash memory channel. The subject technology is not limited to any particular number of flash memory channels. For example, data storage system 100 may include 8 channels, 16 channels, 32 channels, etc.

Figure 2:
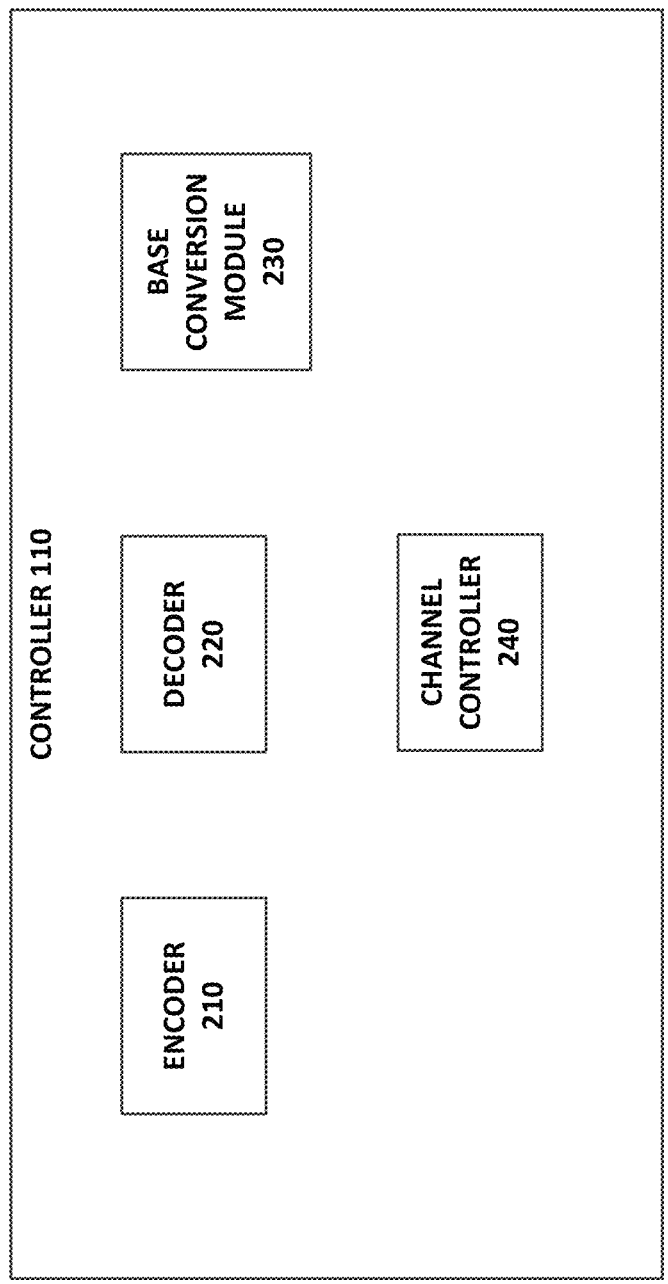
FIG. 2 is a block diagram illustrating components of a controller according to aspects of the subject technology.

FIG. 2 is a block diagram illustrating components of controller 110 according to aspects of the subject technology. As depicted in FIG. 2, controller 110 may include encoder 210, decoder 220, base conversion module 230, and channel controller 240. Controller 110 is not limited to these particular components and may include other types of components. In addition, controller 110 is not limited to single instances of any given component and may be implemented with multiple instances of any of the components.

Encoder 210 is configured to encode data to generate a codeword for storage in non-volatile memory 130. According to aspects of the subject technology, encoder 210 uses a non-binary error-correcting code (ECC) algorithm such as a non-binary low-density parity-check (LDPC) code algorithm to generate the codeword. Decoder 220 is configured to decode a codeword read from non-volatile memory 130 to retrieve the encoded data using the decoding portion of the ECC algorithm used to encode the data. Controller 110 may include multiple instances of encoder 210 and/or decoder 220 to increase available bandwidth for processing data being stored in non-volatile memory 130 and data being read from non-volatile memory 130. Decoder 220 may implement a hard decoding process or a soft decoding process. If multiple instances of decoder 220 are included in controller 110, some of the decoders may be dedicated to hard decoding processes and others to soft decoding processes.

In addition to the components depicted in FIG. 2, controller 110 may include other components. For example, controller 110 may include managers and schedulers for managing read, write, and erase operations within data storage system 100. Controller 110 also may include an address translation manager to manage the translation of host addresses used by host system 150 to physical addresses of the blocks, wordlines and pages within non-volatile memory 130. Other components may include scramblers, descramblers, maintenance managers (e.g., garbage collection, wear leveling, data relocation, etc.).

The components of controller 110 each may be implemented using one or more sequences of instructions (e.g., software/firmware) loaded and executed by a processor or processor core, using hardware logic circuits, or a combination of hardware and software/firmware. For example, in a controller that includes multiple processors or a multi-core processor, individual processors or processor cores may be assigned to provide the functionality of respective components of controller 110. Furthermore, one or more of the components discussed above may be implemented outside of controller 110 without departing from the scope of the subject technology.

Figure 3:
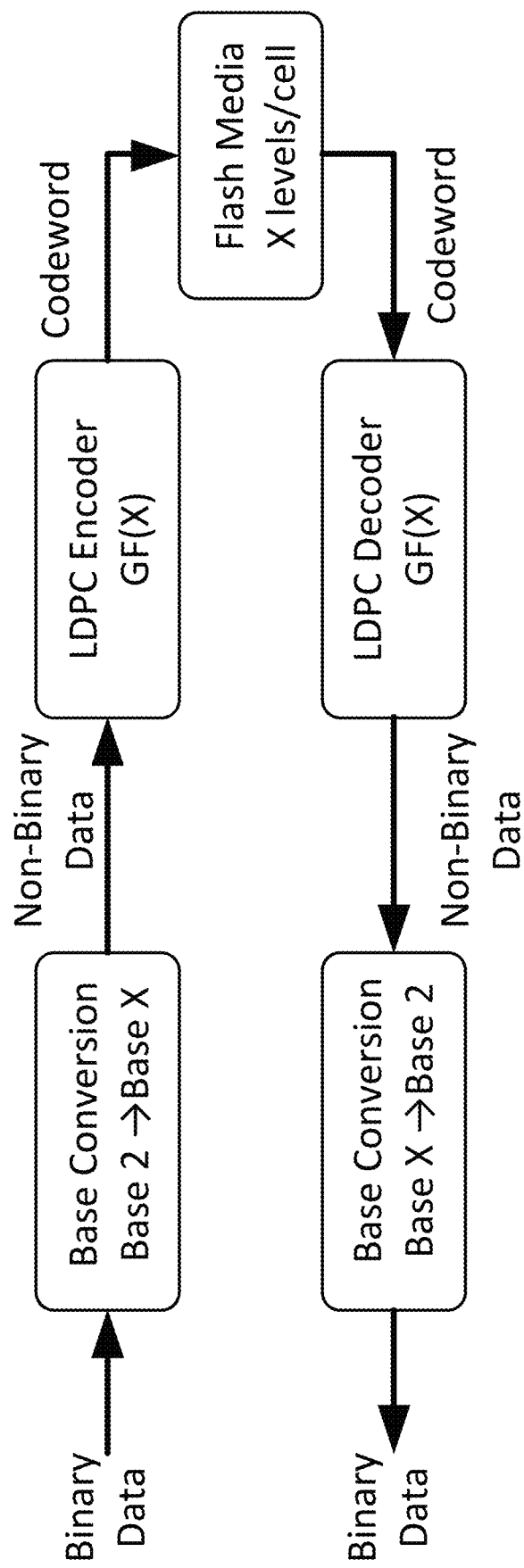
FIG. 3 is a diagram illustrating the flow of data being written to and read from non-volatile memory according to aspects of the subject technology.

FIG. 3 is a diagram illustrating the flow of data being written to and read from non-volatile memory according to aspects of the subject technology. For example, binary data may be received for storage in non-volatile memory device 130. The base-two values of the binary data may be converted to base-X values by base conversion module 230, for example. The non-binary data is then provided to encoder 210 which encodes the non-binary data using a non-binary LDPC encoding algorithm, for example, to generate a codeword. The codeword is then written to a wordline of flash media such as non-volatile memory device 130 via channel controller 240.

Upon reading the codeword from non-volatile memory device 130, decoder 220 decodes the codeword to retrieve the non-binary data using a non-binary LDPC decoding algorithm, for example. The base-X values of the decoded non-binary data are then converted back to binary base-two values by base conversion module 230.

According to aspects of the subject technology, X is an integer having a value greater than two. The value of X is not limited to any particular range of values and may include non-power-of-two integer values. The value of X determines the base for the conversion of the binary data into non-binary data, the symbols of the Galois field used in LDPC encoding and decoding, and the number of program levels used in programming the memory cells of the non-volatile memory device 130.

Data storage systems may have a specified maximum bit error rate (BER) under which the data storage system is designed to operate. Various properties and metrics may impact the BER of a non-volatile memory device. One such metric is a signal-to-noise ratio (SNR) of the flash memory cells. The SNR for a flash memory cell may be represented using the following:

$$SNR = 20\log_{10}\frac{D}{\sigma} \quad (1)$$

where D is the total voltage range of the flash memory cells and σ is a standard deviation of a program level distribution. As the number of program levels used in programming the flash memory cells increases, the SNR must also increase to maintain a specified BER for the non-volatile memory device.

As non-volatile memory devices experience more program-erase cycles, the program level distributions of the memory cells tend to widen which results in larger standard deviations of the program level distributions and smaller SNR. Similarly, lower quality non-volatile memory devices may have relatively wide program level distributions even at lower program-erase cycle counts which again results in larger standard deviations of the program level distributions and smaller SNR. The program level distributions and corresponding SNRs for different numbers of program-erase cycles and/or different quality levels of non-volatile memory devices may be estimated using simulation or testing. The SNRs may then be represented with the corresponding program-erase cycle counts or quality levels.

Accordingly, for a given non-volatile memory device, such as a flash memory die, a number of programming levels is selected that is expected to not exceed the specified BER based on the SNR for the memory cells in the device. For example, if the SNR is below a minimum value to maintain the specified BER for eight program levels but above a minimum value to maintain the specified BER for seven program levels, X may be set to seven. The selection may be made at the time of assembly or manufacture when based on the quality of the flash memory die. The selection also may be made at different stages of life of the flash memory die represented by program-erase cycle counts. For example, a look-up table or other data structure may associate numbers of program levels with respective program-erase cycle counts. As a flash memory die crosses a particular program-erase cycle count during operation, the number of program levels indicated by the value X may be determined from the look-up table entry corresponding to the program-erase cycle count.

Controller 110 also may track read error counts for the non-volatile memory devices. As flash memory die experience read errors, the read error count may be updated and compared against predetermined values that correspond to different values for X. If read error counts increase, the number of program levels represented by the value for X may need to be reduced to reduce read errors for the particular flash memory die.

FIG. 4 is a table listing corresponding values for number of program levels per memory cell, number of encoded bits per memory cell, and numbers of 1 kB, 2 kB and 4 kB codewords that can be stored in a wordline of 16 kB memory cells. For example, when X is set at seven to indicate that seven program levels are available for programming memory cells, the conversion of base-two binary data into base-seven non-binary data and encoding the non-binary data to generate a codeword that is stored in the wordline results into 2.807 encoded bits per cell. At this encoding rate, the data of 44 1 kB binary codewords can be stored in a 16 kB wordline, the data of 22 2 kB binary codewords can be stored in the 16 kB wordline, and the data of 11 4 kB binary codewords can be stored in the 16 kB wordline.

Figure 5:
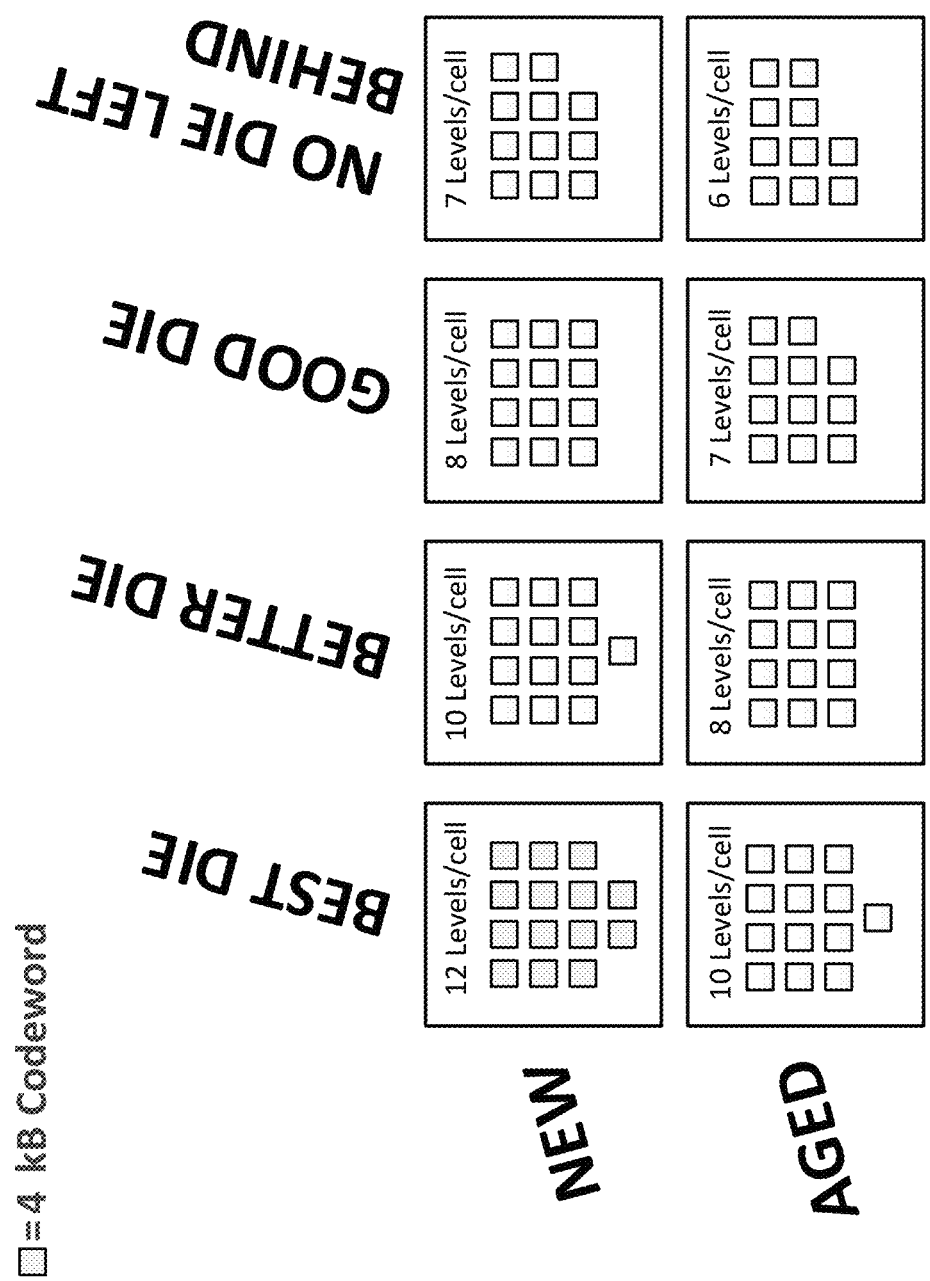
FIG. 5 is a graphical representation of different values of X selected for flash memory die of different ages and quality levels.

FIG. 5 is a graphical representation of different values of X selected for flash memory die of different ages and quality levels. In FIG. 5, ages are represented by "NEW" and "AGED." Quality levels are represented by "BEST DIE," "BETTER DIE," "GOOD DIE" and "NO DIE LEFT BEHIND." The ages and quality levels depicted in FIG. 5 are examples for purposes of explanation. The subject technology is not limited to any particular number of ages or quality levels. The eight larger blocks in FIG. 5 represent flash memory die and indicate example selections of numbers of program levels, represented by the value of X, for different combinations of age and quality level. For example, a new flash memory die that is considered to be at the highest quality level, "BEST DIE," is configured to use 12 program levels to program memory cells in the die. On the other hand, an aged flash memory die that is considered to be at the lowest quality level, "NO DIE LEFT BEHIND," is configured to use 6 program levels to program memory cells in the die. The smaller blocks within the larger blocks in FIG. 5 represent the number of 4 kB binary codewords that can be stored in a 16 kB wordline at the different numbers of program levels. For example, at 12 program levels per cell, the data of 14 4 kB binary codewords can be stored in a 16 kB wordline, while at 6 program levels per cell, the data of 10 4 kB binary codewords can be stored in the 16 kB wordline.

Configuring flash memory die to use the selected number of program levels may be done by the controller 110 issuing a command or programming one or more registers on the flash memory die to specify the number of program levels to be used when programming memory cells on the die and reading the memory cells on the die. Since each program level corresponds to a respective unique symbol/digit of the base-X numbering, the flash memory die only needs to determine and return the respective program level to which each memory cell is programmed when reading data. Accordingly, the subject technology does not utilize gray coding when reading data and avoids the loss of cell-level information that results from the use of gray coding.

Controller 110 may maintain system data to track the numbers of program levels each flash memory die is configured to use. When the selected value for X is changed due to aging of a flash memory device, controller 110 may reconfigure the flash memory die to return to a previous value for X when reading data programmed based on that previous value for X and return to the selected value for X for new data write operations or read operations for data programmed based on the selected value for X. Controller 110 may maintain additional system data to track which wordlines/blocks within a flash memory die were programmed using which numbers of program levels.

In addition to configuring the non-volatile memory devices according to the selected value for X, controller 110 also may configure encoder 210, decoder 220, and base conversion module 230 for the particular selected value for X. Base conversion module 230 may be configurable to adjust the conversion for the selected value for X. Alternatively, base conversion module 230 may include a respective module for each possible value for X and controller 110 may select or activate the module corresponding to the selected value for X.

As noted above, encoder 210 and decoder 220 may utilize a non-binary LDPC algorithm for encoding and decoding data. In this regard, encoder 210 may use a generator matrix to encode the non-binary data to generate a codeword, and decoder 220 may use a parity check matrix in decoding the codeword to retrieve the non-binary data. The LDPC algorithm may be designed to maintain the locations of the non-zero elements in these matrices in the same location regardless of the selected value for X. The values assigned to the non-zero elements for a given value of X may be selected from the symbols/digits of the base-X numbering corresponding to the selected value for X. The specific symbols/digits for each non-zero element may be predetermined and stored in a look-up table or other data structure that is accessible to retrieve the symbols/digits and configure the encoder and decoder.

Figure 6:
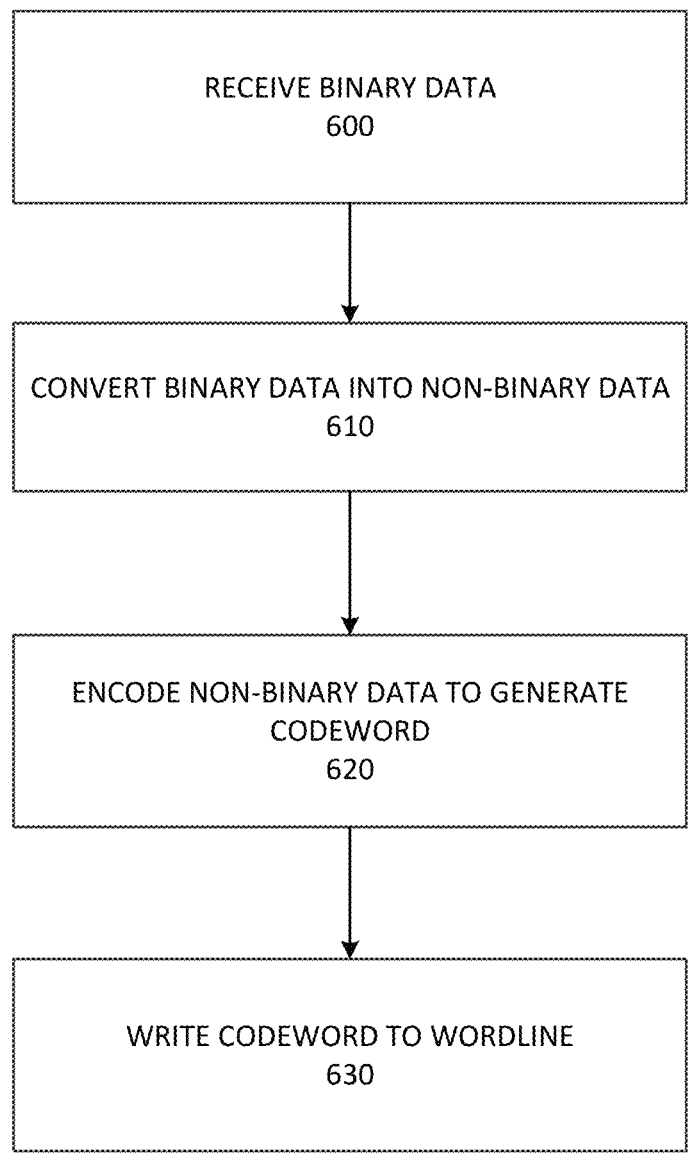
FIG. 6 is a flowchart depicting a process for writing data to a wordline according to aspects of the subject technology.

FIG. 6 is a flowchart depicting a process for writing data to a wordline according to aspects of the subject technology. In block 600 binary data is received for storage in a non-volatile memory device 130. The binary data may be received from host system 150, may be part of system data maintained by controller 110 that needs to be stored in non-volatile memory for preservation, or may be data read from non-volatile memory device 130 as part of a maintenance operation such as garbage collection, wear leveling, internal data movement, etc.

In block 610 the binary data is converted into non-binary data in accordance with the selected value for X corresponding to the non-volatile memory device 130. The non-binary data is encoded to generate a codeword in block 620 and the codeword is written to a wordline in the non-volatile memory device 130 in block 630.

The subject technology allows for the selection of values for X to optimize and balance capacity, endurance, and performance of non-volatile memory devices such as NAND flash memory devices. Different selected values for X controls the number of program levels used for programming memory cells of the non-volatile memory devices. As reflected in the discussion above, providing a range of possible values for X allows individual non-volatile memory devices to be configured to maximize the amount of data stored in the devices while keeping bit error rates below specified values by selecting a value for X based on characteristics of the memory device.

According to aspects of the subject technology, a method is provided that includes receiving binary data for storage in a non-volatile memory device and converting the binary data into non-binary data. The method further includes encoding the non-binary data to generate a codeword and writing the codeword to a wordline of the non-volatile memory device.

Converting the binary data into non-binary data may include converting base-two values of the binary data into base-X values, where X is an integer greater than two. X may be a non-power-of-two integer. Writing the codeword in the wordline of the non-volatile memory device may include programming memory cells of the wordline to respective program levels selected from X available program levels based on values of the non-binary data. Encoding the non-binary data may include generating a non-binary low-density parity-check (LDPC) code, where the generated codeword may include the non-binary data and the non-binary LDPC code.

The method may further include reading the codeword from the wordline of the non-volatile memory device, decoding the codeword to retrieve the non-binary data, and converting the non-binary data back into the binary data.

According to aspects of the subject technology, a data storage system is provided that includes a plurality of non-volatile memory devices, and a controller. The controller may be configured to receive first binary data for storage in the data storage system and convert base-two values of the first binary data into first non-binary data comprising base-X values, where X is an integer greater than two. The controller may further be configured to encode the first non-binary data to generate a first codeword, and write the first codeword to a wordline of a first non-volatile memory device of the plurality of non-volatile memory devices.

The controller may be further configured to write the first codeword to the wordline of the first non-volatile memory device by programming memory cells of the wordline to respective program levels selected from X available program levels based on the values of the first non-binary data. The controller may be further configured to encode the first non-binary data by generating a first non-binary low-density parity-check (LDPC) code, where the generated first codeword comprises the first non-binary data and the first LDPC code.

The controller may be further configured to receive second binary data for storage in the data storage system, convert base-two values of the second binary data into second non-binary data comprising base-Y values, where Y is an integer greater than two and is different from X, and encode the second non-binary data to generate a second codeword. The controller may write the second codeword to a wordline of a second non-volatile memory device of the plurality of non-volatile memory devices.

The controller may be further configured to write the second codeword to the wordline of the second non-volatile memory device by programming memory cells of the wordline to respective program levels selected from Y available program levels based on the values of the second non-binary data.

The controller may be further configured to read the first codeword from the wordline of the first non-volatile memory device, decode the first codeword to retrieve the first non-binary data, and convert the first non-binary data back into the first binary data.

According to aspects of the subject technology, a processor-readable medium is encoded with instructions that, when executed by a processor, perform a method. The method includes associating a non-volatile memory device with a value X based on a property of the non-volatile memory device, wherein X is an integer greater than two, receiving binary data for storage in the non-volatile memory device, converting base-two values of the binary data into non-binary data comprising base-X values, encoding the non-binary data to generate a codeword, and writing the codeword to a wordline of the non-volatile memory device.

The property of the non-volatile memory device may include a program-erase count. The property of the non-volatile memory device also may include a read error count.

Encoding the non-binary data to generate the codeword may include generating a non-binary low-density parity-check (LDPC) code, where the generated codeword comprises the non-binary data and the LDPC code. Writing the codeword to the wordline of the non-volatile memory device may include programming memory cells of the wordline to respective program levels selected from X available program levels based on the values of the non-binary data.

The method may further include reading the codeword from the wordline of the non-volatile memory device, decoding the codeword to retrieve the non-binary data, and converting the non-binary data back into the binary data.

According to aspects of the subject technology, a data storage system including a non-volatile memory device is provided. The data storage system further includes means for receiving binary data for storage in the non-volatile memory device, means for converting base-two values of the binary data into non-binary data comprising base-X values, where X is an integer greater than two. The data storage system further includes means for encoding the non-binary data to generate a codeword, and means for writing the codeword to a wordline of the non-volatile memory device.

The data storage system may further include means for reading the codeword from the wordline of the non-volatile memory device, means for decoding the codeword to retrieve the non-binary data, and means for converting the non-binary data back to the binary data.

Many of the above-described features of example process and related features and applications, may be implemented as software or firmware processes that are specified as a set of instructions recorded on a processor-readable storage medium (also referred to as computer-readable medium). When these instructions are executed by one or more processing unit(s) (e.g., one or more processors, cores of processors, or other processing units), the processing unit(s) are caused to perform the actions indicated in the instructions. Examples of processor-readable media include, but are not limited to, volatile memory 120, non-volatile memory 130, as well as other forms of media such as magnetic media, optical media, and electronic media. The processor-readable media does not include carrier waves and electronic signals communicated wirelessly or over wired connections.

The term "software" is meant to include, where appropriate, firmware residing in memory or applications stored in memory, which may be read into a working memory for processing by a processor. Also, in some implementations, multiple software aspects of the subject disclosure may be implemented as sub-parts of a larger program while remaining distinct software aspects of the subject disclosure. In some implementations, multiple software aspects may also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) may be written in any form of programming language, including compiled or interpreted languages, declarative or procedural languages, and it may be deployed in any form, including as a stand-alone program or as a module, component, subroutine, object, or other unit suitable for use in a computing environment. A computer program may, but need not, correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code).

It is understood that illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject disclosure.

It is understood that the specific order or hierarchy of steps in the processes disclosed is presented as an illustration of some exemplary approaches. Based upon design preferences and/or other considerations, it is understood that the specific order or hierarchy of steps in the processes may be rearranged. For example, in some implementations some of the steps may be performed simultaneously. Thus the accompanying method claims present elements of the various steps in a sample order, and are not meant to be limited to the specific order or hierarchy presented.

The previous description is provided to enable any person skilled in the art to practice the various aspects described herein. The previous description provides various examples of the subject disclosure, and the subject disclosure is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

The phrases "in communication with" and "coupled" mean in direct communication with or in indirect communication with via one or more components named or unnamed herein (e.g., a memory card reader)

A phrase such as an "aspect" does not imply that such aspect is essential to the subject disclosure or that such aspect applies to all configurations of the subject disclosure. A disclosure relating to an aspect may apply to all configurations, or one or more configurations. An aspect may provide one or more examples. A phrase such as an aspect may refer to one or more aspects and vice versa. A phrase such as an "implementation" does not imply that such implementation is essential to the subject disclosure or that such implementation applies to all configurations of the subject disclosure. A disclosure relating to an implementation may apply to all aspects, or one or more aspects. An implementation may provide one or more examples. A phrase such as an "implementation" may refer to one or more implementations and vice versa. A phrase such as a "configuration" does not imply that such configuration is essential to the subject disclosure or that such configuration applies to all configurations of the subject disclosure. A disclosure relating to a configuration may apply to all configurations, or one or more configurations. A configuration may provide one or more examples. A phrase such as a "configuration" may refer to one or more configurations and vice versa.

The word "exemplary" is used to mean "serving as an example or illustration." Any aspect or design described herein as "exemplary" is not necessarily to be construed as preferred or advantageous over other aspects or designs.

What is claimed is:

1. A machine-implemented method for non-volatile memories, comprising:
   for each one of memory portions of the non-volatile memories, selecting a respective number of program levels available for programming the respective one of the memory portions;
   configuring each one of the memory portions to use the selected respective number of program levels;
   converting data into first non-binary data for writing to one of the memory portions of the non-volatile memories;
   generating a codeword based on the first non-binary data;
   writing the codeword to the one of the memory portions; and
   reading the codeword from the one of the memory portions,
   wherein:
   the first non-binary data has a number base, which is based on the selected number of program levels available for programming the one of the memory portions;
   the selected number is greater than two; and
   the reading comprises reading the codeword using the selected number of program levels.

2. The machine-implemented method of claim 1, wherein selecting the respective number of program levels comprises selecting the respective number of program levels available for programming the respective one of the memory portions, based on characteristics of the respective one of the memory portions.

3. The machine-implemented method of claim 2, wherein the non-volatile memories comprise non-volatile memory devices, and each of the memory portions comprises a non-volatile memory device.

4. The machine-implemented method of claim 1, comprising:
   when characteristics of the one of the memory portions change, selecting a new number of program levels for the one of the memory portions;
   reading a second codeword from the one of the memory portions using the selected number of program levels, wherein prior to selecting the new number of program levels, the second codeword has been stored in the one of the memory portions using the selected number of program levels;
   writing a third codeword to the one of the memory portions using the new number of program levels; and
   reading the third codeword from the one of the memory portions using the new number of program levels.

5. The machine-implemented method of claim 1, wherein:
   the reading comprises reading the codeword, without utilizing gray coding, to prevent a loss of cell-level information resulting from a use of gray coding.

6. The machine-implemented method of claim 1, wherein writing the codeword comprises programming memory cells of a wordline of the one of the memory portions to respective program levels selected from N available program levels based on values of the first non-binary data, where N is an integer greater than two.

7. The machine-implemented method of claim 1, wherein converting the data into the first non-binary data comprises converting base-two values of the data into base-N values, where N is an integer greater than two.

8. A data storage system, comprising:
   non-volatile memories comprising memory portions; and
   one or more controllers configured to cause:
   for each one of the memory portions of the non-volatile memories, selecting a respective number of program levels available for programming the respective one of the memory portions;
   configuring each one of the memory portions to use the selected respective number of program levels;
   converting data into first non-binary data for writing to one of the memory portions of the non-volatile memories;
   generating a codeword based on the first non-binary data;
   writing the codeword to the one of the memory portions; and
   reading the codeword from the one of the memory portions,
   wherein:
   the first non-binary data has a number base, which is based on the selected number of program levels available for programming the one of the memory portions;
   the selected number is greater than two; and
   the reading comprises reading the codeword using the selected number of program levels.

9. The data storage system of claim 8, wherein selecting the respective number of program levels comprises selecting the respective number of program levels available for programming the respective one of the memory portions, based on characteristics of the respective one of the memory portions.

10. The data storage system of claim 9, wherein the non-volatile memories comprise non-volatile memory devices, and each of the memory portions comprises a non-volatile memory device.

11. The data storage system of claim 8, wherein the one or more controllers are configured to cause:
    when characteristics of the one of the memory portions change, selecting a new number of program levels for the one of the memory portions;
    reading a second codeword from the one of the memory portions using the selected number of program levels, wherein prior to selecting the new number of program levels, the second codeword has been stored in the one of the memory portions using the selected number of program levels;
    writing a third codeword to the one of the memory portions using the new number of program levels; and
    reading the third codeword from the one of the memory portions using the new number of program levels.

12. The data storage system of claim 8, wherein:
    the reading comprises reading the codeword, without utilizing gray coding, to prevent a loss of cell-level information resulting from a use of gray coding.

13. The data storage system of claim 8, wherein writing the codeword comprises programming memory cells of a wordline of the one of the memory portions to respective program levels selected from N available program levels based on values of the first non-binary data, where N is an integer greater than two.

14. The data storage system of claim 8, wherein the number base of the first non-binary data is based on a number of program levels available for programming and reading the non-volatile memories.

15. The data storage system of claim 8, wherein converting the data into the first non-binary data comprises converting base-two values of the data into base-N values, where N is an integer greater than two.

16. An apparatus, comprising:
non-volatile memories;
for each one of memory portions of the non-volatile memories, means for selecting a respective number of program levels available for programming the respective one of the memory portions;
means for configuring each one of the memory portions to use the selected respective number of program levels;
means for converting data into first non-binary data for writing to one of the memory portions of the non-volatile memories;
means for generating a codeword based on the first non-binary data;
means for writing the codeword to the one of the memory portions; and
means for reading the codeword from the one of the memory portions,
wherein:
the first non-binary data has a number base, which is based on the selected number of program levels available for programming the one of the memory portions;
the selected number is greater than two; and
the means for reading comprises means for reading the codeword using the selected number of program levels.

17. The apparatus of claim 16, wherein the means for selecting the respective number of program levels comprises means for selecting the respective number of program levels available for programming the respective one of the memory portions, based on characteristics of the respective one of the memory portions.

18. The apparatus of claim 16, comprising:
means for selecting a new number of program levels for the one of the memory portions, when characteristics of the one of the memory portions change;
means for reading a second codeword from the one of the memory portions using the selected number of program levels, wherein prior to selecting the new number of program levels, the second codeword has been stored in the one of the memory portions using the selected number of program levels;
means for writing a third codeword to the one of the memory portions using the new number of program levels; and
means for reading the third codeword from the one of the memory portions using the new number of program levels.

19. The apparatus of claim 16, wherein the means for converting the data into the first non-binary data comprises means for converting base-two values of the data into base-N values, where N is an integer greater than two.

20. The apparatus of claim 16, wherein:
the means for reading comprises means for reading the codeword, without utilizing gray coding, to prevent a loss of cell-level information resulting from a use of gray coding.

\* \* \* \* \*